US010033367B2

(12) United States Patent
Pavao-Moreira et al.

(10) Patent No.: US 10,033,367 B2
(45) Date of Patent: Jul. 24, 2018

(54) INTEGRATED CIRCUIT FOR SATURATION DETECTION, WIRELESS DEVICE AND METHOD OF DETECTING SATURATION

(71) Applicants: Cristian Pavao-Moreira, Frouzins (FR); Dominique Delbecq, Fonsorbes (FR); Birama Goumballa, Larra (FR); Didier Salle, Toulouse (FR)

(72) Inventors: Cristian Pavao-Moreira, Frouzins (FR); Dominique Delbecq, Fonsorbes (FR); Birama Goumballa, Larra (FR); Didier Salle, Toulouse (FR)

(73) Assignee: NXP USA, Inc., Austin, TX (US)

( * ) Notice: Subject to any disclaimer, the term of this patent is extended or adjusted under 35 U.S.C. 154(b) by 469 days.

(21) Appl. No.: 14/702,809

(22) Filed: May 4, 2015

(65) Prior Publication Data

US 2016/0154092 A1 Jun. 2, 2016

(30) Foreign Application Priority Data

Dec. 2, 2014 (WO) .................. PCT/IB2014/003038

(51) Int. Cl.
*G01S 7/32* (2006.01)
*H03K 5/19* (2006.01)
*H03K 19/0175* (2006.01)
*G01S 7/03* (2006.01)
*G01S 7/35* (2006.01)
*G01S 7/40* (2006.01)
(Continued)

(52) U.S. Cl.
CPC ................ *H03K 5/19* (2013.01); *G01S 7/032* (2013.01); *G01S 7/354* (2013.01); *G01S 7/4021* (2013.01); *G01S 13/345* (2013.01); *G01S 13/931* (2013.01); *H03K 19/017509* (2013.01)

(58) Field of Classification Search
CPC ....................................................... H03K 5/19
USPC .............................................. 342/91–92, 175
See application file for complete search history.

(56) References Cited

U.S. PATENT DOCUMENTS

| | | | | |
|---|---|---|---|---|
| 4,060,801 A | * | 11/1977 | Stein .................... | G01R 13/405 345/38 |
| 4,217,587 A | * | 8/1980 | Jacomini .................. | H01Q 3/36 342/372 |
| 7,271,852 B2 | | 9/2007 | Paik et al. | |

(Continued)

FOREIGN PATENT DOCUMENTS

EP         2141804 A1      1/2010

OTHER PUBLICATIONS

Analog Devices—Data sheet AD8284. 'Radar Receive Path AFE: 4—Channel Mux with LNA, PGA, AAF and ADC', 28 pages.

*Primary Examiner* — Marcus E Windrich
(74) *Attorney, Agent, or Firm* — Charlene R. Jacobsen

(57) ABSTRACT

An integrated circuit for saturation detection comprises: a plurality of gain components; a plurality of saturation detectors with each saturation detector operably coupled to an output of one of the gain components; a plurality of logic elements with a first input of each logic element associated with an output of one of the saturation detectors; and a controller operably coupled to the plurality of logic elements. The controller is arranged to apply a signal to a second input of individual ones of the plurality of logic elements such that an output of the respective logic element identifies a saturation event of the saturation detector associated with that respective logic element.

13 Claims, 12 Drawing Sheets

(51) Int. Cl.
    *G01S 13/34*    (2006.01)
    *G01S 13/93*    (2006.01)

(56)            References Cited

U.S. PATENT DOCUMENTS 8,374,294  B2*   2/2013   Cho ................. H03G 3/3036
                                                       330/129
2006/0055579  A1*   3/2006   Fontaine ............. H03M 3/36
                                                       341/155
2007/0076827  A1    4/2007   Beamish et al.
2007/0264946  A1*  11/2007   Rozenblit ............ H03F 1/32
                                                       455/127.1
2011/0218020  A1*   9/2011   Ripley ............... H03F 1/0272
                                                       455/571
2012/0319774  A1   12/2012   Ibrahim et al.
2013/0038352  A1*   2/2013   Gupta ................ H03K 5/19
                                                       327/20

* cited by examiner

INTEGRATED CIRCUIT FOR SATURATION DETECTION, WIRELESS DEVICE AND METHOD OF DETECTING SATURATION

CROSS REFERENCE TO RELATED APPLICATION(S)

The present application claims priority to International Patent Application No. PCT/IB2014/003038, entitled "INTEGRATED CIRCUIT FOR SATURATION DETECTION, WIRELESS DEVICE AND METHOD OF DETECTING SATURATION," filed on Dec. 2, 2014, the entirety of which is herein incorporated by reference.

FIELD OF THE INVENTION

The field of this invention relates to integrated circuit for saturation detection, a wireless device and method of detecting saturation.

BACKGROUND OF THE INVENTION

Automotive radar solutions for advanced driver assistance systems (ADAS) are currently being deployed on a large scale. These solutions can typically be grouped into long range radar (LRR) applications and short range radar (SRR) applications. Both of these applications generally use frequency modulated continuous wave (FMCW) modulation techniques in order to be able to identify a radar target, such as a car or a pedestrian.

These radar systems typically utilise millimeter wave (MMW) frequencies for transmission and reception. In current Automotive Radar systems, several receivers and transmitters are often implemented in a single radar device in order to improve the system sensitivity, range and resolution, in order to achieve a better target identification. In such systems, especially in the receiver section, variable gain amplifier stages (VGA) and saturation detectors (SD) are often used in order to detect the presence of strong interferers that may saturate receiver components or circuits, and then compromise the received signal integrity. By combining the saturation detection function with the automatic gain control (AGC) of the variable gain stages, it is possible to maintain the received signal inside a suitable range, thereby allowing the microcontroller unit (MCU) to correctly proceed with the signal processing and interpretation thereof.

In a multistage/multichannel radar receiver context, all saturation detection signals are typically combined into a single output, largely to save cost in providing multiple saturation detectors outputs and reduce pin or ball count and as shown in FIG. 1. Typically, the combining function is implemented using an 'OR' logic gate, whereby a trigger is raised if any of the saturation detection signals identifies a saturation event.

FIG. 1 schematically shows a known integrated circuit 100 comprising gain components and saturation detectors employed in a radar device. The illustrated integrated circuit 100 is a three receiver/channel radar device. For simplicity, only one of the stages/channels will be described in detail. Referring to the first receiver/channel 150, a received radio frequency (RF) signal 102 is down-converted by mixer 104 when mixed with a local oscillator signal to produce an intermediate frequency or baseband signal 106. The intermediate frequency or baseband signal 106 output from mixer 104 is subsequently passed to a first gain stage 112. Concurrently, the intermediate frequency or baseband signal 106 output from mixer 104 is also input to a first saturation detector 114, to determine whether the signal has been subject to saturation in the mixer 104. The first gain stage 112 comprises a high pass filter 108 and a variable gain amplifier (VGA) 110. If the first saturation detector 114 detects a saturation event, the first saturation detector 114 outputs a logic '1' to an input of a second saturation detector 116. Otherwise, if the first saturation detector 114 does not detect a saturation event, it outputs a logic '0' to the input of the second saturation detector 116.

An output of the first gain stage 112 is coupled to an input of a second gain stage 120. Concurrently, the output of the first gain stage 112 is also coupled to a further input of the second saturation detector 116. The second saturation detector 116 comprises a logic 'OR' gate 122, which receives the output from the first saturation detector 114 and an output from the second saturation detector 116. In this manner, the second saturation detector 116 outputs a logic '1' in response to receiving a saturated output from the first gain stage 112 or an indication of a saturation event in the mixer 104 from the first saturation detector 114. If either, or both, of the outputs received by the logic 'OR' gate 122 signify a saturation event, the logic 'OR' gate outputs a logic '1' to an input of a third saturation detector 124. Otherwise, the logic 'OR' gate outputs logic '0' to the input of the third saturation detector 124. The second gain stage 120 comprises similar components to the first gain stage 112 and is arranged to provide its output to a third saturation detector 124. The operation of the third saturation detector is the same as the second saturation detector 116. The output 128 of the third saturation detector 124 is input to a buffer 130, comprising a three input logic 'OR gate 132 for receiving the saturation detector output from each of the receiver/channels and an output drive stage 134. If, for example, the output 128 from the first receiver/channel comprises an indication of a saturation event, in a form of a logic '1', which is signaled via output 136 to an external controller (not shown). The external controller then reduces the gain of all of the gain stages across all of the receivers/channels throughout the integrated circuit 100, in order to remove the saturation event.

However, besides providing an advantage in respect of a higher integration level and reduced pin/ball counting, this solution does not allow a possibility to discover which channel or receiver, or which gain stage within the radar receiver is saturating. In such a case, the AGC that reduces a gain of a given amplifier stage gain if a saturation is detected applies the gain reduction in all receive channels and stages at the same time. As such, the identification of a saturation event and the treatment of this results in a robust, non-accurate and non-specific reduction in signal level across all channels, thereby resulting in loss of receiver sensitivity, inefficiency and sub-optimal signal level range.

In modern radar devices and systems, pins/balls counting and power consumption must both be drastically reduced in order to decrease the IC package size and cost, and also to facilitate customer integration with a simpler board. In such a context, outputting each individual saturation detector output on a dedicated pin is also not a viable solution.

SUMMARY OF THE INVENTION

The present invention provides an integrated circuit for saturation detection, a wireless device and a method for detecting saturation as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
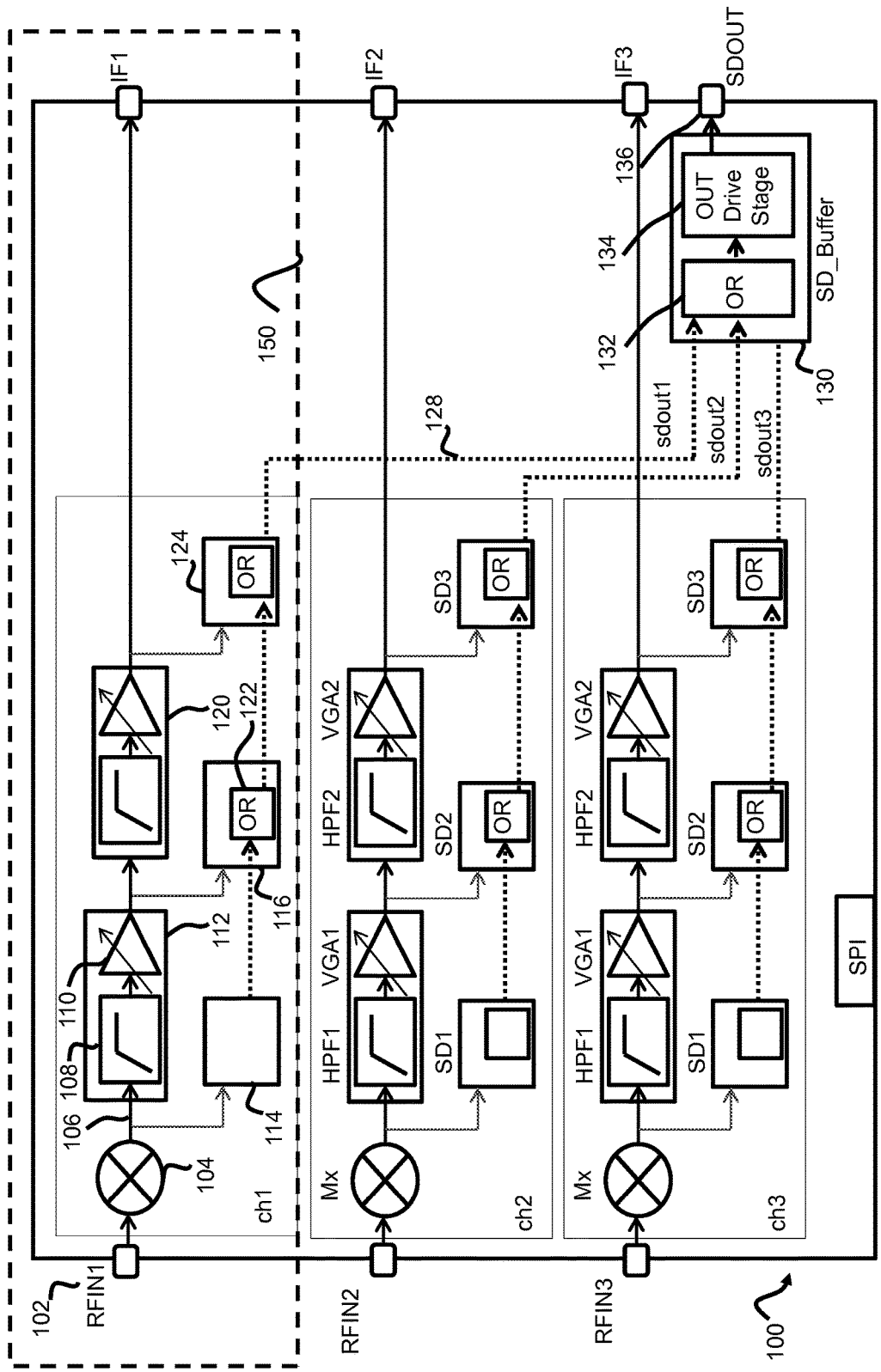
FIG. 1 schematically shows a known integrated circuit with gain components and saturation detectors employed in a radar device.

A problem with the known implementation of a multiple stage, multiple radar receiver in FIG. 1 is that, although a saturation event can be detected, there is no way of determining the receiver/channel and/or gain stage therein that is causing the saturation event. Typically, an automatic gain control (AGC) function applies a gain reduction on all stages of all receivers/channels, which results in a non-optimal and inaccurate procedure when dealing with a saturation event.

Figure 2:
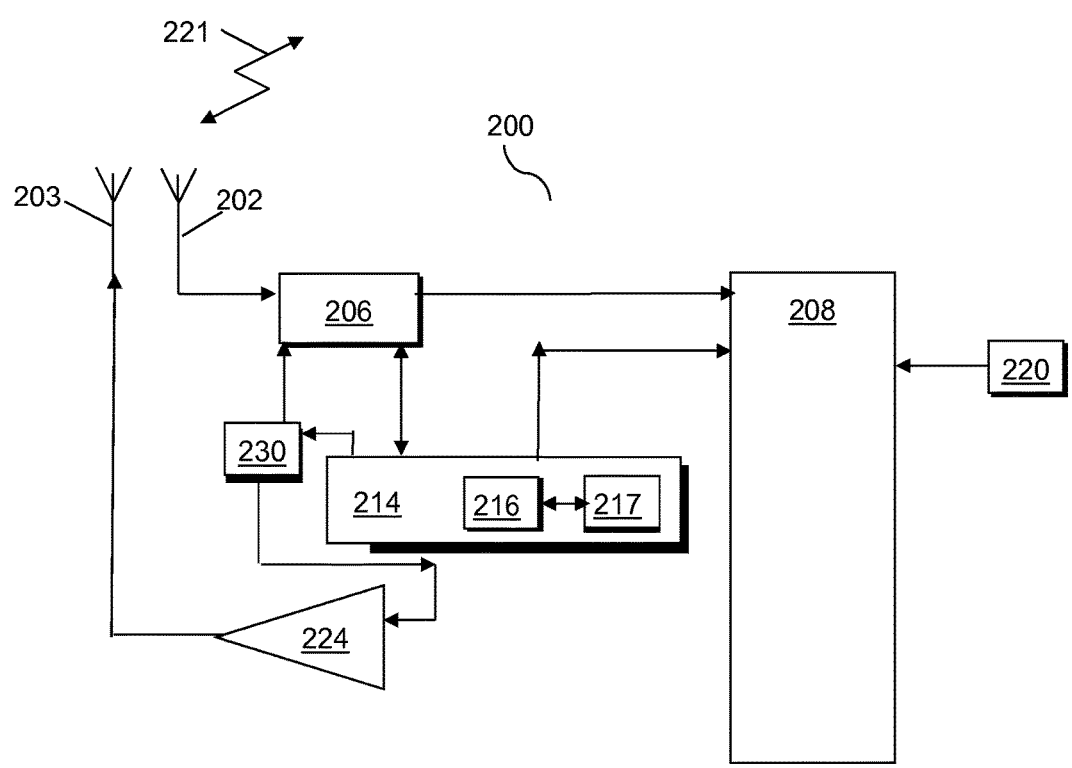
FIG. 2 illustrates an example block diagram of a wireless device.

Referring to FIG. 2, a block diagram of a wireless device, adapted in accordance with some examples, is shown. Purely for explanatory purposes, the wireless device is described in terms of a radar device 200 operating at MMW frequencies. The radar device 200 contains one or several antennas 202 for receiving transmissions 221, and one or several antennas 203 for the transmitter, with one shown for each for simplicity reasons only. The number of antennas 202, 203 used depends on the number of radar receiver and transmitter channels implemented in a given radar device. One or more receiver chains, as known in the art, include receiver front-end circuitry 206, effectively providing reception, frequency conversion, filtering and intermediate or base-band amplification, and finally an analog to digital conversion. In some examples, such circuits or components may reside in signal processing module 208, dependent upon the specific selected architecture. The receiver front-end circuitry 206 is coupled to a signal processing module 208 (generally realized by a digital signal processor (DSP)). A skilled artisan will appreciate that the level of integration of receiver circuits or components may be, in some instances, implementation-dependent.

The controller 214 maintains overall operational control of the radar device 200, and in some examples may comprise time-based digital functions (not shown) to control the timing of operations (e.g. transmission or reception of time-dependent signals, FMCW modulation generation, etc.) within the radar device 200. The controller 214 is also coupled to the receiver front-end circuitry 206 and the signal processing module 208. In some examples, the controller 214 is also coupled to a buffer module 217 and a memory device 216 that selectively stores operating regimes, such as decoding/encoding functions, and the like.

As regards the transmit chain, this essentially comprises a power amplifier 224 coupled to the transmitter antenna 203, antenna array, or plurality of antennas. The transmitter comprises the PA 224 and frequency generation circuit 230 that are both operationally responsive to the controller 214.

A single processor may be used to implement a processing of receive signals, as shown in FIG. 2. Clearly, the various components within the radar device 200 can be realized in discrete or integrated component form, with an ultimate structure therefore being an application-specific or design selection.

In radar device 200, radar transceiver topology is different from traditional wireless communication architectures (e.g. Bluetooth™, WiFi™, etc.), as modulation occurs within a phase locked loop (PLL) (typically via the fractional-N divider), and is applied directly to the PA 224. Therefore, in some examples, the receiver front-end circuitry 206 and transmitter PA 224 are operably coupled to a frequency generation circuit 230 that comprises a voltage controlled oscillator (VCO) circuit and PLL and fractional-N divider (not shown) arranged to provide local oscillator signals to down-convert modulated signals to a final intermediate or baseband frequency or digital signal.

Figure 3:
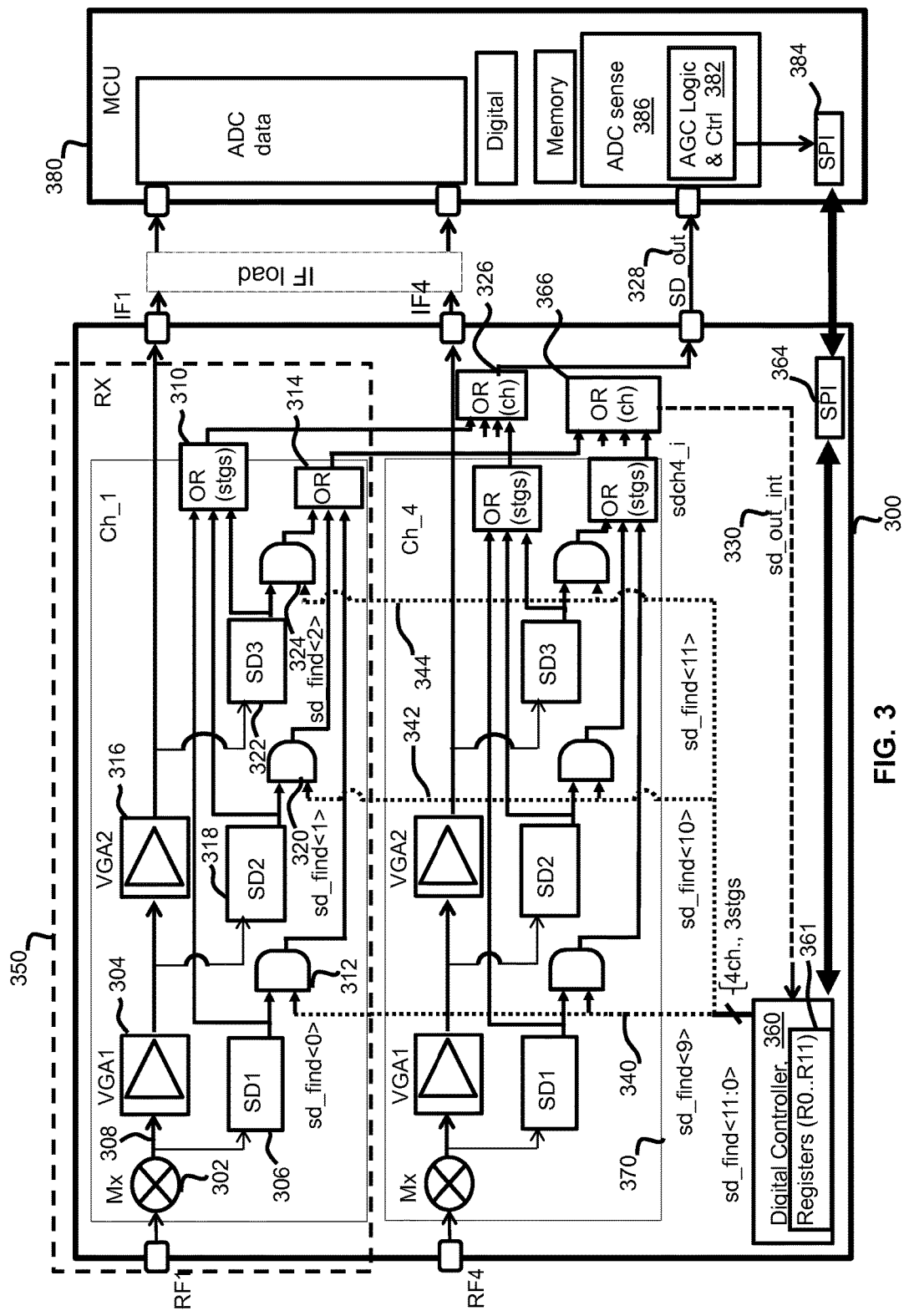
FIG. 3 illustrates a first simplified example representation of an integrated circuit with gain components and saturation detectors employed in a radar device.

Referring to FIG. 3, a first simplified example representation of an integrated circuit 300 with gain components and saturation detectors employed in a radar device is illustrated. In this example, only two (from four) receivers/channels, for example as may be found in receiver front-end circuitry 206 of FIG. 2, have been illustrated for simplicity. However, in other examples, it is envisaged that any number of receivers/channels may be implemented.

The first channel 350 comprises a mixer 302 whose output is operably coupled to a first variable gain amplifier 304 and a first saturation detector 306. The mixer 302 receives an RF signal and subsequently down-mixes the received RF signal with a local oscillator signal to output an intermediate frequency (or in other examples a baseband signal) 308. The first saturation detector 306 outputs either a logic '1' if a saturation event has been detected in the down-mixed RF signal, or a logic '0', if no saturation event has been detected. The first saturation detector 306 outputs the logic signal to an input of a logic element 310, which in this example is a three input logic 'OR' gate. Further, the output from the first saturation detector 306 is also input to a further logic element 312, which in this example is a two input logic 'AND' gate. An output of the further logic element 312 is coupled to an input of a yet further logic element 314, which is also a three input logic 'OR' gate.

In this example, the output of the first variable gain amplifier 304 is coupled to a second variable gain amplifier 316 and to a second saturation detector 318. The second saturation detector 318 is coupled to logic element 320, which is a two input logic 'AND' gate. Again, depending on whether a saturation event has been detected, the second saturation detector 318 either outputs a logic '1' or logic '0' to an input of logic element 320.

In this example, the output of the second variable gain amplifier 316 is routed to a first intermediate frequency output port of the integrated circuit 300, which is subsequently input to a port of a microcontroller unit (MCU) 380. Within the integrated circuit 300 the output of the second variable gain amplifier 316 is also routed to an input of a third saturation detector 322. The operation of the third saturation detector 322 is substantially the same as that of second saturation detector 318 and first saturation detector, in that it outputs a logic '1' to logic element 324 if a saturation event is detected and a logic '0' to logic element 324 if a saturation event has not been detected. In this example, outputs of each of the saturation detectors 306, 318, 322 is input to logic element 310. Similarly, in this example, outputs of each of logic elements 312, 320, 324 is input to logic element 314. If at least one saturation event has been detected within receiver/channel 350, the logic element 310 outputs a logic '1' to a further logic element 326, which in this example is a four input logic 'OR' gate. Logic element 326 is arranged to receive outputs from similar logic elements 310 on different channels, as illustrated with fourth receiver/channel. If logic element 326 receives an indication of at least one saturation event, i.e. a logic '1' in this example, logic element 326 outputs a logic '1' on 'SD_out' port 328 to inform the MCU 380 of the saturation event. Otherwise, if there is not at least one detected saturation event, the logic element 326 outputs a logic '0' on 'SD_out' 328.

The operation of other receivers/channels, such as fourth illustrated receiver/channel 370 is substantially the same as the operation described for the first channel 350, and as such will not be described further.

In this example, if the MCU 380, via for example an analog to digital converter (ADC) sense circuit 386, is informed of a saturation event via logic element 326, the MCU 380 may subsequently initiate a test procedure to determine the saturation detector that is associated with the saturation event. This may be performed via, for example, a Serial Peripheral Interface bus (SPI) 384 as shown. In this example, the ADC sense circuit 386 informs a digital controller 360 to initiate the test procedure via an SPI register 364 located within integrated circuit 300. At this point, it should be noted that the combined output 'SD_out' 328 is unable to inform the AGC logic and control circuit 382 of a particular, single saturation detector that has registered a saturation event.

In this example, the digital controller 360 is operably coupled to a further input of logic elements 312, 320 and 324 (and associated logic devices from other channels). The digital controller 360 may comprise associated registers 361, which are arranged to store the individual saturation detectors 306, 318, 322 instantaneous states each time a saturation event is detected. In some examples, the register arrangement 361 is arranged to store the instantaneous states of the saturation detectors 306, 318, 322 during a FMCW 'chirp' output by the integrated circuit 300 or at the beginning of an inter-chirp operation.

In this example, the digital controller 360 is arranged to implement the test procedure by individually testing/scanning each saturation detector 306, 318, 322 in turn. In some examples, the digital controller 360 is responsible for applying a scanning pattern of logic elements 312, 320, 324. In some examples, the logic path from the saturation detectors 306, 318, 322 to the logic elements 312, 320, 324 may mirror the behaviour of each of the saturation detector 306, 318, 322 outputs. In this manner, the test procedure may be applied by the controller 360, without affecting the processing of the real-time signals.

Figure 6:
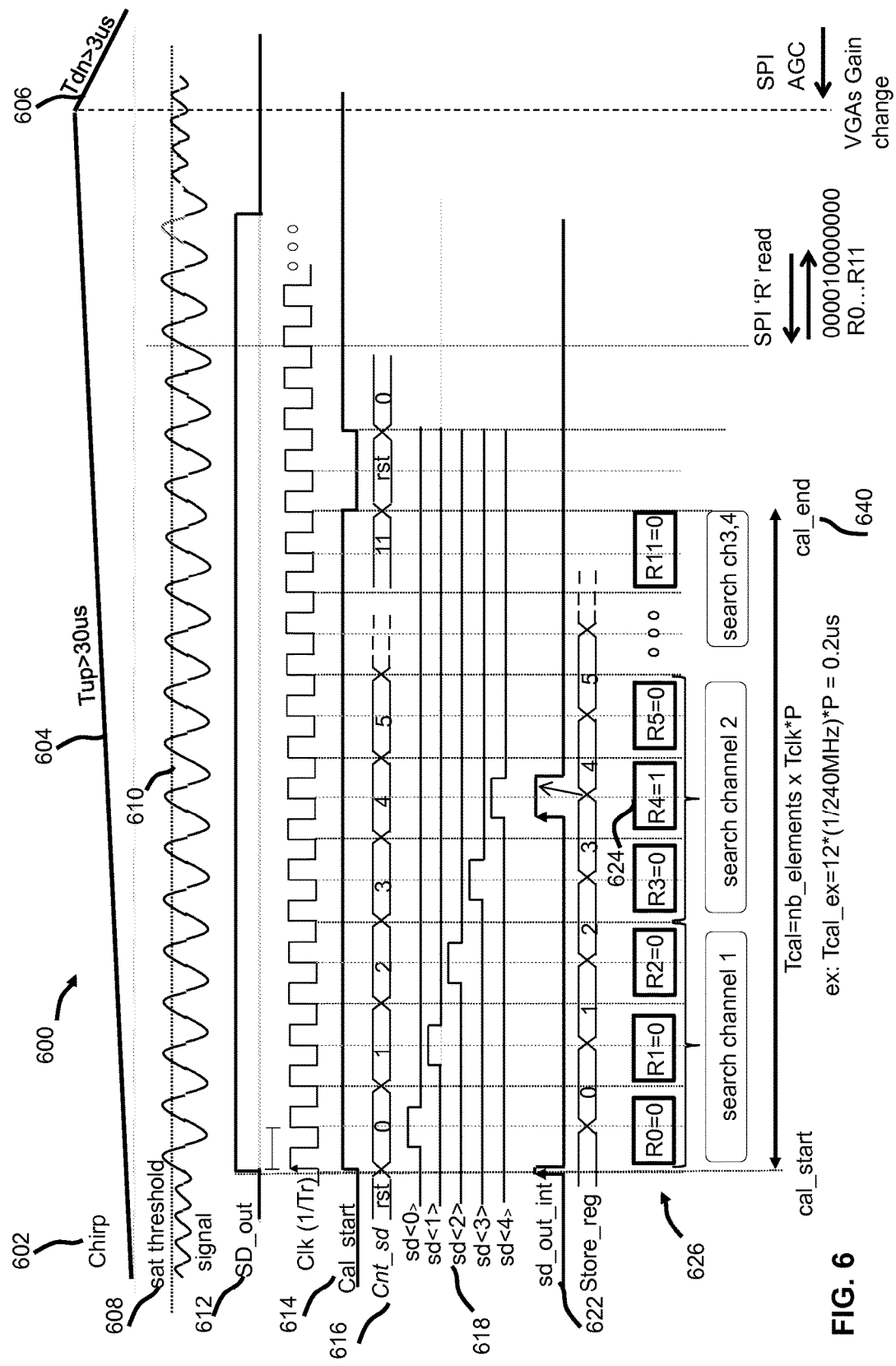
FIG. 6 illustrates an example of a timing diagram associated with the first simplified example representation of an integrated circuit.

In some examples, the digital controller 360 may be responsible for generating a scanning pattern, as well as controlling storage of the scanning results in registers 361, as described further with respect to FIG. 6.

In the presence of a saturation event, signaled to the MCU 380 via logic element 326, identified by the ADC sense circuit 386 and informed to the digital controller 360 of the integrated circuit 300, the digital controller 360 may then initiate an internally controlled scanning method. In one example, the digital controller 360 may apply a logic '1' to each further input of logic elements 312, 320, 324 in turn. Each of the logic elements 312, 320, 324 in the first receiver/channel, as well as logic elements in other receivers/channels, is input to one or more logic 'OR' gates 366. As such, the output from the one or more logic 'OR' gates 366 is a logic '1' when one of the input signals is a logic '1'.

Thus, in the illustrated example, the logic elements 312, 320, 324 are AND logic gates, such that the output of the AND gate that already receives a logic '1' from a saturation event will output a logic '1' only when it coincides with receiving a logic '1' from the digital controller 360 during the scanning method. Hence, when the scanning method applies a logic '1', in turn, to each of the logic elements 312, 320, 324 on the first receiver/channel, and thereafter on the other receivers/channels, a determination of the saturation event (and notably identifying the associated amplifier stage) can be made by determining a timing instant of a logic '1' output from the logic 'OR' gate 366. As such, a comparison of the timing of the pulses applied to the logic elements 312, 320, 324 (and others) in the scanning method with an output on 'sd_out_int' 330 from the logic 'OR' gate 366 indicates the logic element that is coupled to a saturation detector that is subjected to a saturation event.

Examples describe a method of saturation detection in a wireless device comprising a plurality of gain components operably coupled to a plurality of saturation detectors with each saturation detector operably coupled to an output of one of the gain components. One method comprises coupling an output of each of the plurality of saturation detectors to a respective first input of a logic element associated with the respective saturation detector; applying a signal to a second input of individual ones of the plurality of logic elements; and identifying a saturation event of the saturation detector associated with that respective logic element based on the output of the respective logic element.

Figure 4:
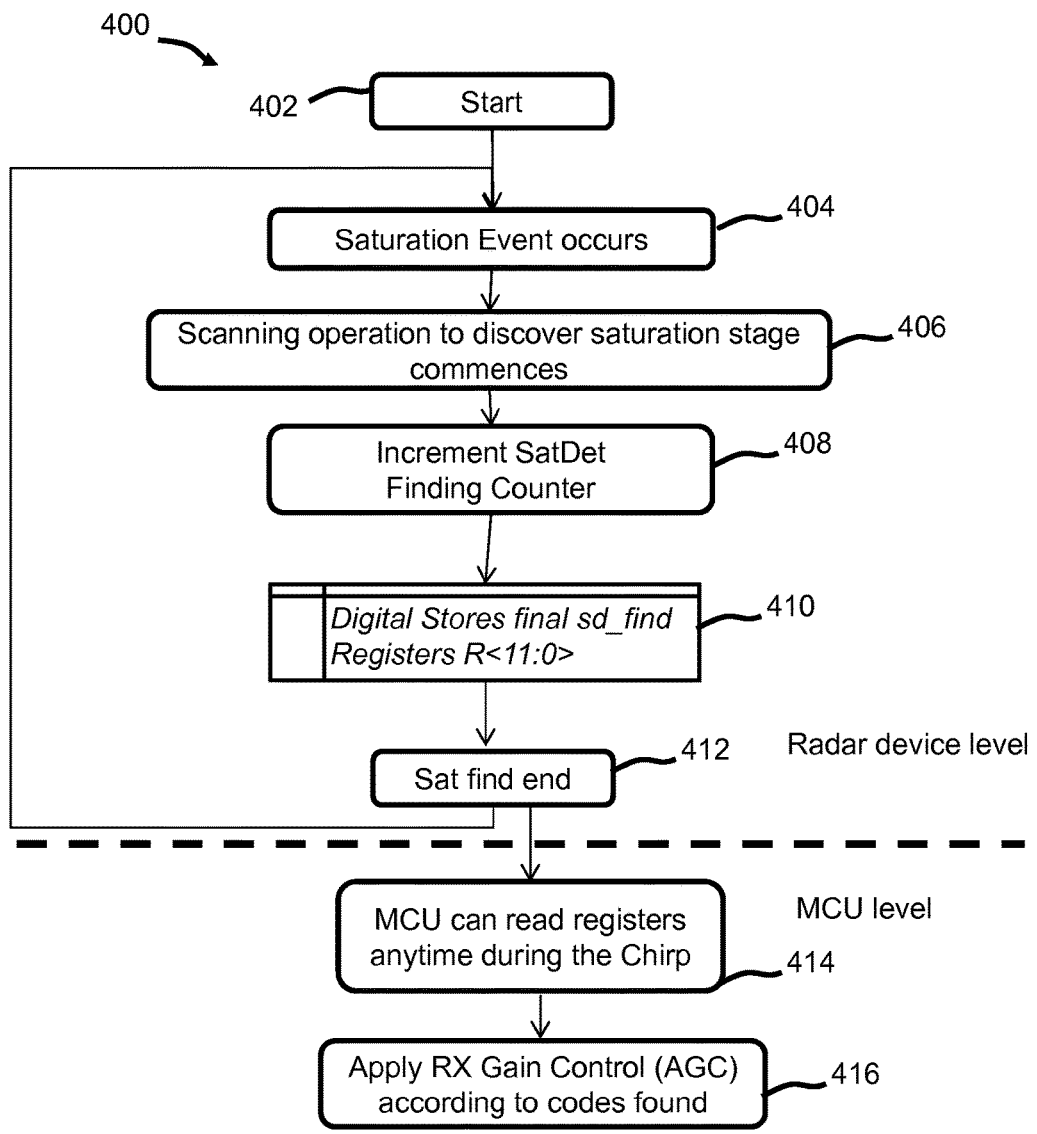
FIG. 4 illustrates an example flowchart associated with the first simplified example representation of an integrated circuit.

FIG. 4 illustrates an example flowchart 400 associated with the scanning operation of the integrated circuit 300 of FIG. 3. At 402 the process starts and at 404 a saturation event occurs. In one example, MCU 380 of FIG. 3 may be informed of the saturation event, which may trigger the scanning operation. Thus, the scanning operation to discover the saturation stage commences at 406. At 408 each saturation detector on each channel is tested, in turn, by applying a logic '1' to the AND logic gate associated with, and coupled to a respective saturation detector output, e.g. AND gate 312 coupled to saturation detector 306 of FIG. 3. The output 330 from respective 'OR' logic gates, e.g. logic gates 314 followed by 366 of FIG. 3 in this case, identifies whether or not a saturation event has occurred at first mixer 302. If a saturation event has occurred at first mixer 302, it is identified as such by saturation detector 306 with a logic '1' applied to 'AND' logic gate 312, which is 'ANDed' to a logic '1' pulse by digital controller and provides a logic '1' input to logic 'OR' gate 314, and thereafter a logic '1' input to logic 'OR' gate 366. The identification of a saturation event for this amplifier stage/saturation detector is stored in register 361 at 410. This scanning operation that applies a logic '1' pulse to the next AND logic gate/saturation detector arrangement and the process continues until all the required saturation detectors on the receivers/channels have been tested. Subsequently, the scanning operation ends at 412.

After the scanning operation has completed, the MCU 380 of FIG. 3 may be informed via SPI 364 and SPI 384. For example, the MCU 380 may subsequently, at 414, read the registers at any time during a 'chirp' of the radar device, or at the beginning of an inter-chirp operation, in order to determine which registers, associated with respective saturation detectors and amplifier stages, has been identified as exhibiting a saturation event. In this manner, a real time status of saturation events may be determined during a 'chirp'.

At 416, the automatic gain control (AGC) logic and control circuit 382 of the MCU 380 is able to apply AGC to the receiver element or circuit that is saturating based on the information read from the associated register. For example, the MCU 380 may be able to reduce gain on a specific channel and/or reduce gain on a specific stage preceding the relevant element or component or circuit that is saturating.

Thus, in this manner, MCU 380 (or another microprocessor device) may be arranged to program the AGC logic and control circuit 382 according to the register values previously read by SPI access, and apply AGC during an inter-chirp time to effect a gain change (e.g. a reduction of gain) of one or more amplifier stage(s) inside a receiver/channel of the radar device, according to the stage(s) identified as saturating during the chirp or at the beginning of an inter-chirp operation.

Figure 5:
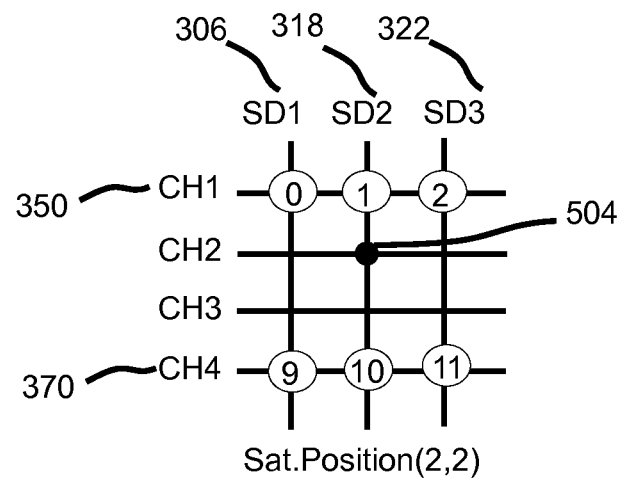
FIG. 5 illustrates examples of a matrix and a register arrangement that may be employed in the integrated circuit of FIG. 3.
Figure 5:
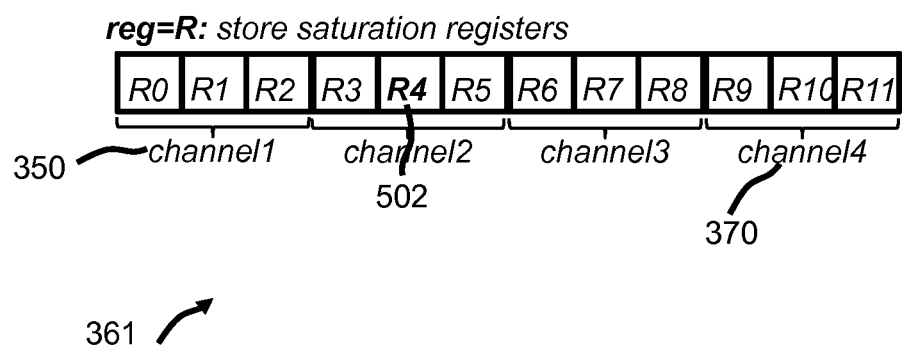

In this example, register 361 may comprise a series of register bits R0 to R11, which are capable of storing outputs in a four receiver/channel-three stage per receiver/channel configuration, i.e. a '4×3' matrix, as illustrated in FIG. 5.

In some examples, the scanning operation may be repeated several times within each 'chirp', or at the beginning of an inter-chirp operation, wherein the register 361 can be refreshed after each Trefresh or Tcal time. In this example, the total calibration time represents the time required to discover where the saturation event(s) has occurred, and is dependent on the number of elements in the matrix (Nb_elements) and a multiple (P) of a clock period (Tclk) that is in charge of the scanning operation timing, see equation [1]. P is an integer value (>2) representing the over-clocking rate needed for correct operation of the scanning operation, for example to provide a margin to wait for the saturation event arriving and a reset performed on each scanning window when the scanning sequence is moved through the matrix.

$$Tcal = Nb\_elements \times Tclk \times P \quad [1]$$

In some examples, and according to the number of saturation events counted by ADC sense circuit 386 during a single 'chirp' at 'SD-out' 328, the MCU 380 can decide whether or not to read the stored values in the registers 361, for example by extracting a binary sequence 12-bit word that contains data about the saturated stage(s) and the receiver (s)/channel(s) that the stage is located in. The MCU 380 can then apply, via the SPI interfaces 384, 364, AGC on the appropriate stage of the receiver during the inter-chip (ramp down) time.

Referring to FIG. 5, an example of a matrix 500 and a register arrangement 361 having a number of register bits (e.g. twelve) that may be employed in the integrated circuit 300 of FIG. 3 is illustrated. The matrix 500 relates to an example of a 4×3 matrix, comprising saturation detectors 306, 318, 322 from the first channel 350 of integrated circuit 300. In this example, the register arrangement 361 comprises twelve register bits from R0 to R11, wherein each channel comprises three individual register bits, one individual register bit for each saturation detector in that receiver/channel. The digital controller (e.g. digital controller 360 from FIG. 3) may implement a scanning operation to test each node on the matrix 500, so that all saturation detectors are tested individually. In this example it can be seen that a saturation event has been identified at node 504 and stored in register bit R4 502, relating to a saturation event within the second channel. Therefore, once the scanning method has been completed, and the relevant values stored in the register arrangement 361, the MCU 380 can determine the individual stage that is subject to the saturation event and apply suitable AGC to the appropriate circuit or component (as identified in matrix 500) during the inter-chirp (ramp down) time. In some examples, this real-time determination of a saturation event may be made during a 'chirp', or at the beginning of an inter-chirp operation, thereby advantageously allowing specific dynamic control of individual gain components that registered a saturation event.

Referring to FIG. 6, an example of a timing diagram 600 associated with the integrated circuit 300 from FIG. 3 and the flow chart of FIG. 4 is shown.

In this example, the radar 'chirp' 602 comprises a 'Tup' portion 604 of thirty microseconds and a 'Tdown' portion 606 of three microseconds. A received signal 608 of sinusoidal nature has been illustrated as saturating above a threshold level 610. This causes the 'SD_out' signal 612 (equivalent to the SD_out signal 328 of FIG. 3) to register a logic '1', thereby indicative of a saturation event. In this illustrated timing diagram example, a saturation event is maintained until the received signal 608 falls below the saturation threshold 610. MCU 380 of FIG. 3 may then initiate a scanning operation by triggering a 'cal start' signal to test the matrix of twelve elements/amplifier stages within the integrated circuit 300, which in this example is a 4×3 matrix requiring twelve counter increments. Before performing a scanning operation all of the saturation detector states are reset to '0'. The scanning operation (or scanning pattern) comprises forcing a logic '1' sequentially on each SD output, whilst keeping the non-scanned output at '0' level. In this manner, a polling of the SD output values can be sequentially performed. Thus, the twelve counter increments, illustrated by 'cnt_sd' signal 616, enable a logic '1' pulse 618 to be applied to successive logic 'AND' gates in the circuit of FIG. 3. In this example, the 'cnt_sd' signal 616 is reset after the relevant number of saturation detectors has been tested.

The 'sd_out_int' signal 622 is then inspected. In this example, when applying a successive logic '1' pulse 618 to successive logic 'AND' gates, an 'sd_out_int' signal 622 of logic '0' suggests that there is not a saturation event for the saturation detector associated with the respective logic 'AND' gate. However, as shown, when a logic '1' pulse is applied to saturation detector 4, an 'sd_out_int' signal 622 of logic '1' identifies a saturation event. In some examples, a corresponding register 624 within the associated registers 626 stores the logic '1' value representative of the saturation event. At 640, the calibration ends, and the MCU is able to read, via say an SPI, the associated register arrangement within the remaining period of 'Tup' 604. In some examples, the registers may be re-populated or refreshed a number of times within the period 'Tup' 604.

Subsequently, during 'Tdown' 606, the MCU, say MCU 380 from FIG. 3, is able to apply AGC to relevant VGAs corresponding to the saturation detector(s) that registered a saturation event.

Figure 7:
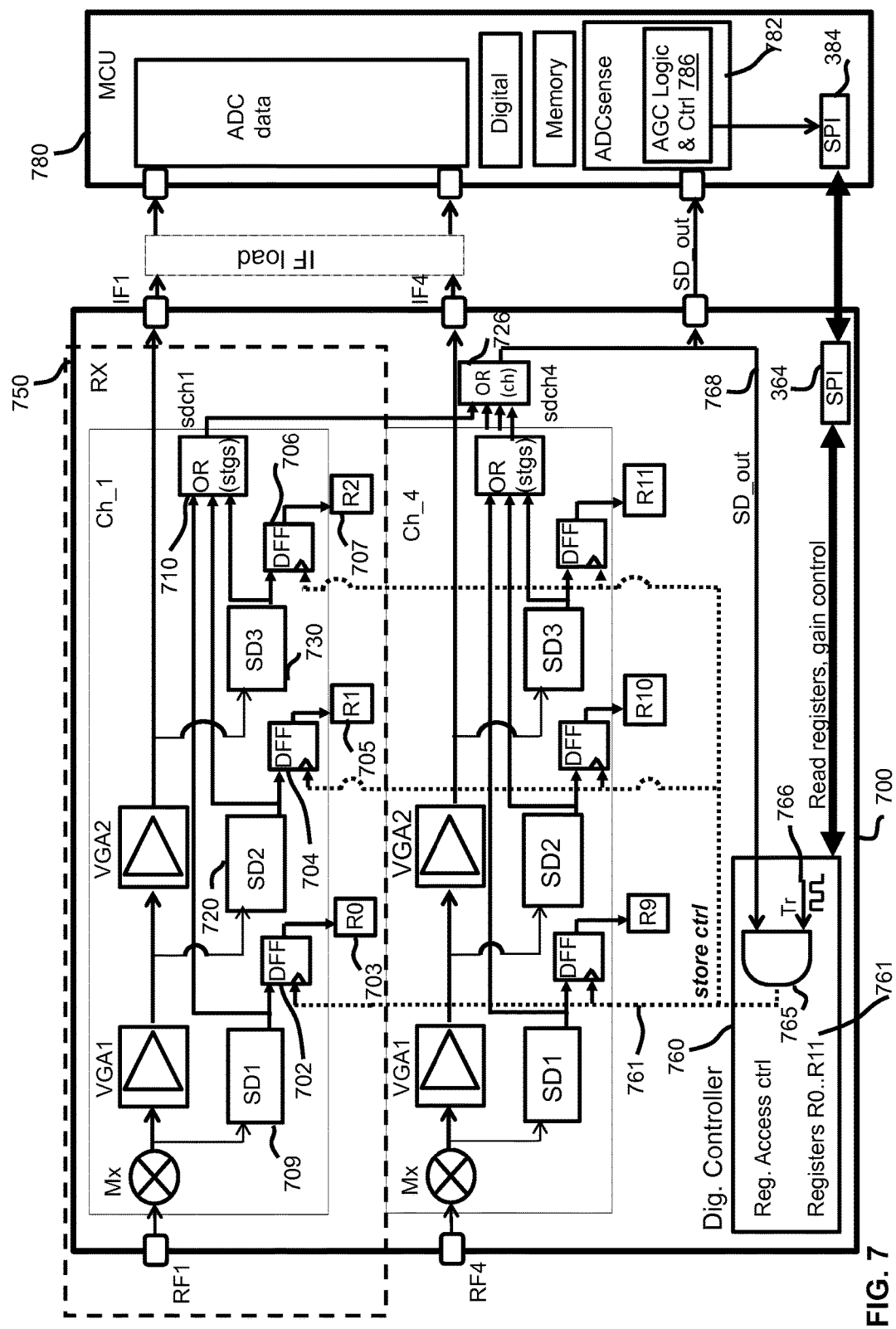
FIG. 7 illustrates a second simplified example representation of an integrated circuit with gain components and saturation detectors employed in a radar device.

Referring to FIG. 7, a second simplified example representation of an integrated circuit 700 is illustrated. For clarity, only one channel 750 of the second simplified example representation of the integrated circuit 700 will be described in detail.

In this example, the logic elements 312, 320, 324 of FIG. 3, representative of logic 'AND' gates in previous examples, have been replaced by different logic elements 702, 704, 706. The logic elements 702, 704, 706 represent digital flip flops (DFFs), although in other examples they may represent simple flip flop devices or the like. Each output of the logic elements 702, 704, 706 may be operably coupled to individual unit memory elements, for example individual registers within the digital controller 760. For explanatory purposes, each logic element 702, 704, 706 has been illustrated as being operably coupled to an associated register. In other examples, the associated registers may be located within register arrangement 761, within the digital controller 760. Therefore, in this example logic element 702 has been operably coupled at its output to individual register bit 'R0' 703, logic element 704 has been operably coupled to individual register bit 'R1' 705 and logic element 706 has been operably coupled to individual register bit 'R2' 707.

The digital controller 760 additionally comprises a logic element 765, which in one example is representative of a logic 'AND' gate. The logic element 765 receives a clock signal 'Tr' 766 and an 'SD_out' signal 768 from a logic element 726, which in this example is a logic 'OR' gate and thus may operate in a similar way to associated logic element 326, 366 in FIG. 3.

Unlike the example representation of the integrated circuit 300 from FIG. 3, the integrated circuit 700 does not utilise a predetermined scanning operation (or sequence or pattern) for discovering the relevant saturation detector and associated receiver/channel and/or amplifier stage that has caused the saturation event. In this example, each output from the saturation detectors 709, 720, 730 within the matrix is mirrored to an input of the logic elements 702, 704, 706. A second input of the logic elements 702, 704, 706 may be a control input, which is arranged to receive a control signal ('store ctrl') 761 selectively output by the digital controller 760. In this example, the control signal 761 may be utilised to control the instant where the saturation detector outputs are stored in their associated individual register bits 703, 705, 707.

In an example operation, saturation detector 720 may register a saturation event during a 'chirp', which will subsequently cause logic element 710 to output a logic '1'. In this manner, logic element 710 operates in a similar way to associated logic element 310 of FIG. 3. This causes an 'SD_out' signal 768 of logic '1' to be output from logic element 726 and then received by both the ADC sense circuit 782 within the MCU 780 and an input of logic element 765 within the digital controller 760. In response to the received signal, a 'store ctrl' signal 761 is generated within the digital controller 760 and output to the logic elements 702, 704, 706, e.g. DFFs. In some examples, the 'store ctrl' signal 761 may be refreshed at a predetermined periodicity, for example by clock signal Tr 766, or at a clock rate 1/Tr. In some examples, the logic element 765 may implement the refresh function by acting as a logic combiner.

In this example, the 'SD_out' signal 768, which in this example represents a logic '1', is received by the logic element 765 along with the clock signal 'Tr' 766. When both the clock signal 'Tr' 766 and the 'SD_out' signal 768 are both logic '1', a 'store ctrl' signal 761 is output by the logic element 765. This forces the logic elements 702, 704, 706 to freeze/store their current value within their associated register bits 703, 705, 707 during each rising edge of the 'store ctrl' signal 761. In some other examples, the logic elements 702, 704, 706 may freeze/store their current value during a different part of the 'store ctrl' signal 761, for example a falling edge.

Subsequently, the MCU 780 is then able to access, in real-time, the actual statuses of the associated registers of the register arrangement 761 via SPI interfaces 384 and 364. Thus, the MCU 780 is able to determine, by utilising ADC sense circuit 786 and via SPI interfaces 384, 364, the number of saturation events by analysing the logic values stored in the associated registers. The AGC logic and control circuit 786 of MCU 780 can then determine and apply AGC to relevant identified VGAs within the integrated circuit 700 in a similar manner as described with relation to FIG. 3, for example during an 'inter-chirp' time.

In other examples, the control and refresh logic may be implemented in other ways. Furthermore, the placement and number of registers, receiver/channels and stages may be also variable and dependent on user requirements, radar device receiver architecture and/or radar system topology requirements.

Figure 8:
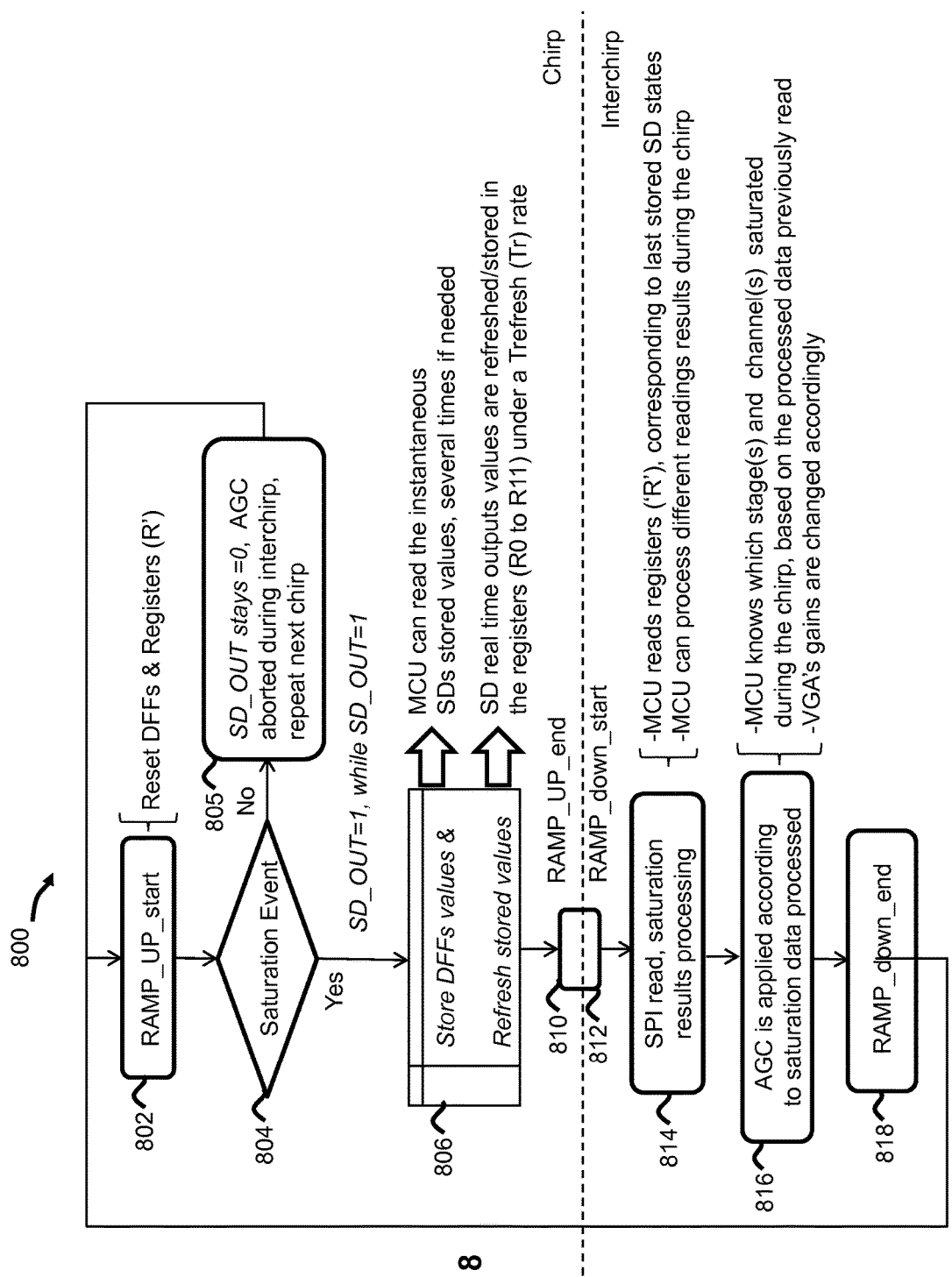
FIG. 8 illustrates an example flowchart associated with the second simplified example representation of an integrated circuit.

Referring to FIG. 8, an example flowchart 800 associated with the second simplified example representation of the integrated circuit of FIG. 7 is illustrated.

Initially, at 802, the process commences at a 'chirp' ramp-up time, and the digital controller 760 resets logic elements 702, 704, 706 and associated register bits 703, 705, 707 of first receiver/channel and other logic elements and registers of other receivers/channels. If a saturation event occurs during a 'chirp', an 'SD_out' signal 768 with a value of logic '1' is output. If a saturation event does not occur during the 'chirp', an 'SD_out' signal 768 with a value of logic '0' is output. The logic value informs the MCU to abort AGC during the 'inter-chirp' phase at 805, and to wait until the next 'chirp' by returning to 802. At 806, a store control signal is generated, for example inside the digital controller 760 of FIG. 7. This control signal may be refreshed at a given periodicity (Tr or Trefresh) or clock rate (1/Tr). In this example, outputs of saturation detectors may be stored for each rising edge of the store control signal, assuming there is a corresponding 'SD_out' signal 768 of logic '1'. Further, the associated register bits 703, 705, 707 may be refreshed/stored at a Trefresh (Tr) rate (see FIG. 9).

Thereafter, the MCU is able to read the instantaneous values stored in the registers and, if necessary, the MCU is able to read the instantaneous values several times during each 'chirp'. At 810 the 'chirp' ends, and the 'inter-chirp' ramp down begins at 812.

At 814, the MCU may read the associated register bits 703, 705, 707 corresponding to the last stored saturation detector 709, 720, 730 outputs, wherein the MCU can process a number of readings of the associated register bits 703, 705, 707 during a given 'chirp'. At 816, the MCU may apply AGC according to the saturation/event data processed. Therefore, the MCU knows, from the read associated register bits 703, 705, 707 (and others), which stage(s) and/or receiver(s)/channel(s) have saturated during the 'chirp'. At 818, the 'inter-chirp' ramp down period ends and the process returns to 802.

Figure 9:
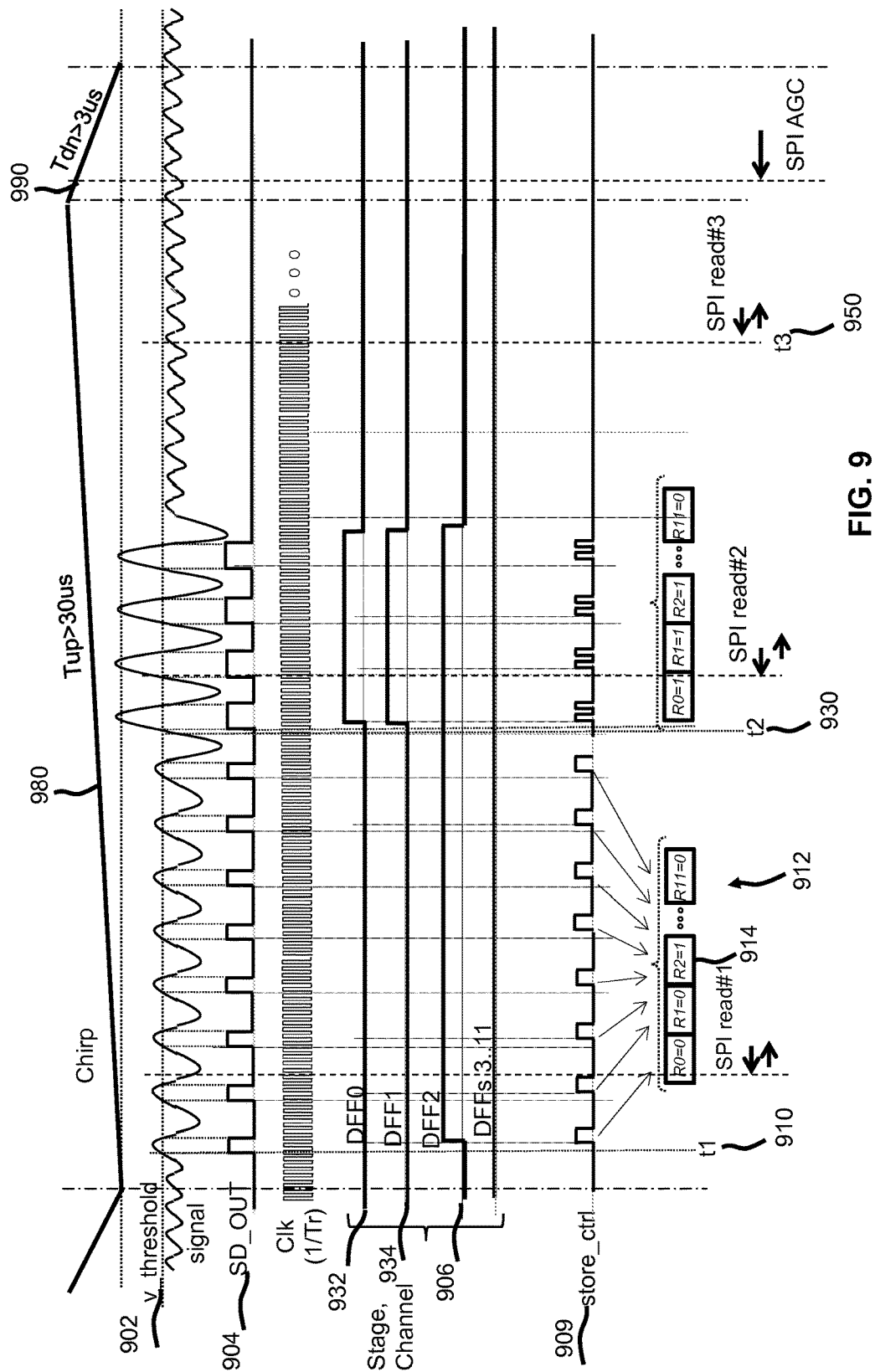
FIG. 9 illustrates an example of a timing diagram associated with the second simplified example representation of an integrated circuit.

Referring to FIG. 9, an example of a timing diagram 900 associated with the second simplified example representation of the integrated circuit 700 of FIG. 7 and the flow chart 800 of FIG. 8 is illustrated. In this example, the timing diagram 900 illustrates a saturation event occurring in different stages of a single receiver channel, which in this example is channel 750 of FIG. 7.

At time 't1' 910, a received signal 902 exhibits a saturation event, resulting in associated 'SD_out' pulse signal 904 at each saturation occurrence. In this example, 'DFF2' 906 detects the saturation event by outputting a logic '1' signal. At each rising edge of 'store ctrl' signal 909, the current outputs of the saturation detectors are instantaneously stored in associated registers 912. In the example of 't1' 910, register bit 'R2' 914 associated with 'DFF2' 906 has recorded the saturation event. As a result, the MCU is able to read the associated registers 912, which may appear for example as a digital word '001000000000'.

At 't2' 930, a second saturation event occurs in the same channel, illustrated by the increased peaks and troughs of received signal 902. In this example saturation events have also occurred on 'DFF0' 932, 'DFF1' 934, as well as 'DFF2' 906. As a result, digital word 111000000000 may be read by the MCU, as registers 936 and 938 associated with 'DFF0' 932 and 'DFF1' 934 respectively have stored the current output values.

At 't3' 950, all saturation events have been removed, for example as a result of the MCU implementing an AGC process. As a result, none of the associated registers 914 are populated with a logic '1', and the MCU is no longer triggered to read the associated registers 914.

In this example, the MCU has accessed the associated registers 914 three times during the 'chirp' 980. However, the MCU can access, via SPIs, the actual status of these associated registers 914 at any time during the 'chirp' 980. In this example, the number of accesses made by the MCU is based on the number of saturations that the MCU counts at 'SD_Out' 904 via its ADC sense circuit.

According to the number of saturation events counted, the MCU can then apply AGC to one or more specific VGAs of the receiver during the 'inter-chirp' region 990.

Figure 10:
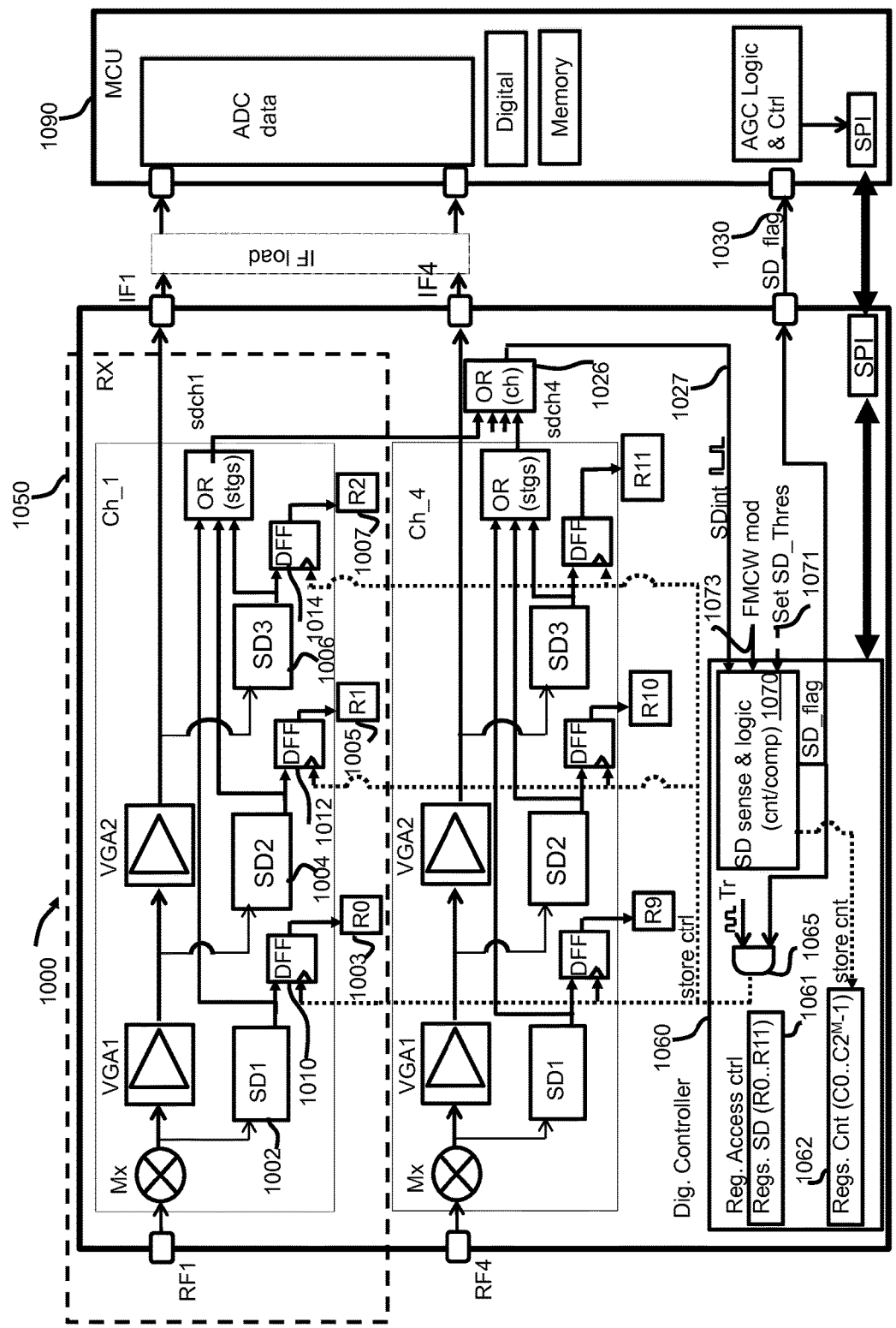
FIG. 10 illustrates a third simplified example representation of an integrated circuit with gain components and saturation detectors employed in a radar device.

Referring to FIG. 10, a third simplified example representation of an integrated circuit 1000 is illustrated. For clarity, only one channel 1050 of the third simplified example representation of the integrated circuit 1000 will be described in detail.

In this example, the digital controller 1060 additionally comprises a saturation detector sense and logic circuit 1070, which replaces the ADC sense circuit 386 from FIG. 3 and ADC sense circuit 786 from FIG. 7. Integrating the saturation detector sense and logic circuit 1070 within the digital controller 1060 provides an advantage of removing dependency on the external MCU 1090, which simplifies the saturation detection procedure. As the external MCU no longer comprises an ADC sense circuit, the previous output signals 'SD_out' that were utilised in FIG. 7 and FIG. 3, have been replaced by an 'SD_flag' output 1030. In this example, the 'SD_flag' output 1030 is generated by the saturation detection sense and logic circuit 1070, wherein the 'SD_flag' output 1030 transitions to a high logic level '1' only if a number of counted saturation events is above a predetermined threshold level.

In an example operation, logic element 1026 provides an output high logic signal '1' if any one (or more) of the saturation detectors 1002, 1004, 1006 records a saturation event, which is similar to the operation of logic elements 326, 726 from FIGS. 3 and 7. However, in this example, the output from logic element 1026 is not output to the MCU 1090 using the 'SD_out' output port. Rather, it is input to the saturation detector sense and logic circuit 1070 located within the digital controller 1060 as signal 'Sdint' 1027, which may be similar to output signal 'SD_out' 328 and 768, from FIG. 3 and FIG. 7 respectively.

In this example, a 'FMCW mod' signal 1073 originating from a related radar digital controller may control the modulation signal, i.e. the chirp/inter-chirp timing. This signal is input to the saturation detection sense and logic circuit 1070.

A threshold level within the saturation detector sense and logic circuit 1070 can be set by an external signal 'SD_Thres' 1071, which may have originated from a related radar digital controller. The external signal 'SD_Thres' 1071 may be pre-set with a saturation threshold during device start-up, 'chirp' start or 'chirp' sequence start. If the number of saturation events signaled from logic element 1026 exceeds the pre-set threshold, the register bits (R0-R11) are frozen, which represent the instantaneous states of the saturation detector outputs. The saturation detector sense and logic circuit 1070 outputs a 'SD_flag' signal 1030 having a logic '1' to the MCU 1090, as well as to an input of logic element 1065. The value of the 'SD_flag' signal 1030 may be maintained for the full duration of the 'chirp'. Therefore, in this example, once the pre-set threshold level within the saturation detector sense and logic circuit 1070 has been exceeded, the value of the 'SD_flag' signal 1030 is not changed until the end of the current 'chirp'.

In this example, the 'SD_flag' signal 1030 may also control the storage timing of the saturation detectors' 1002, 1004, 1006 instantaneous outputs to their associated registers 1003, 1005, 1007. In some examples, this may be achieved by controlling when the logic element 1065 outputs a 'store ctrl' signal 1062 to the relevant logic elements 1010, 1012, 1014. Furthermore, in some examples, the 'SD_flag' output 1030 may indicate to the MCU 1090 when it can access register data 1061.

In this manner, by providing the saturation detector sense and logic circuit 1070 within the digital controller 1060, as well as outputting a simplified 'SD_flag' output 1030, a simplified method for detecting saturation events may be achieved. Further, this method may avoid a 'ringing' interface output (SD_out), and exhaustive storage commands during a 'chirp'.

Additionally, in some examples, a counter final value within the saturation detector sense and logic circuit 1070 may be stored in count register 1062 at the end of each 'chirp'. This may store an indication of the number of saturation events that occurred during the 'chirp'.

Figure 11:
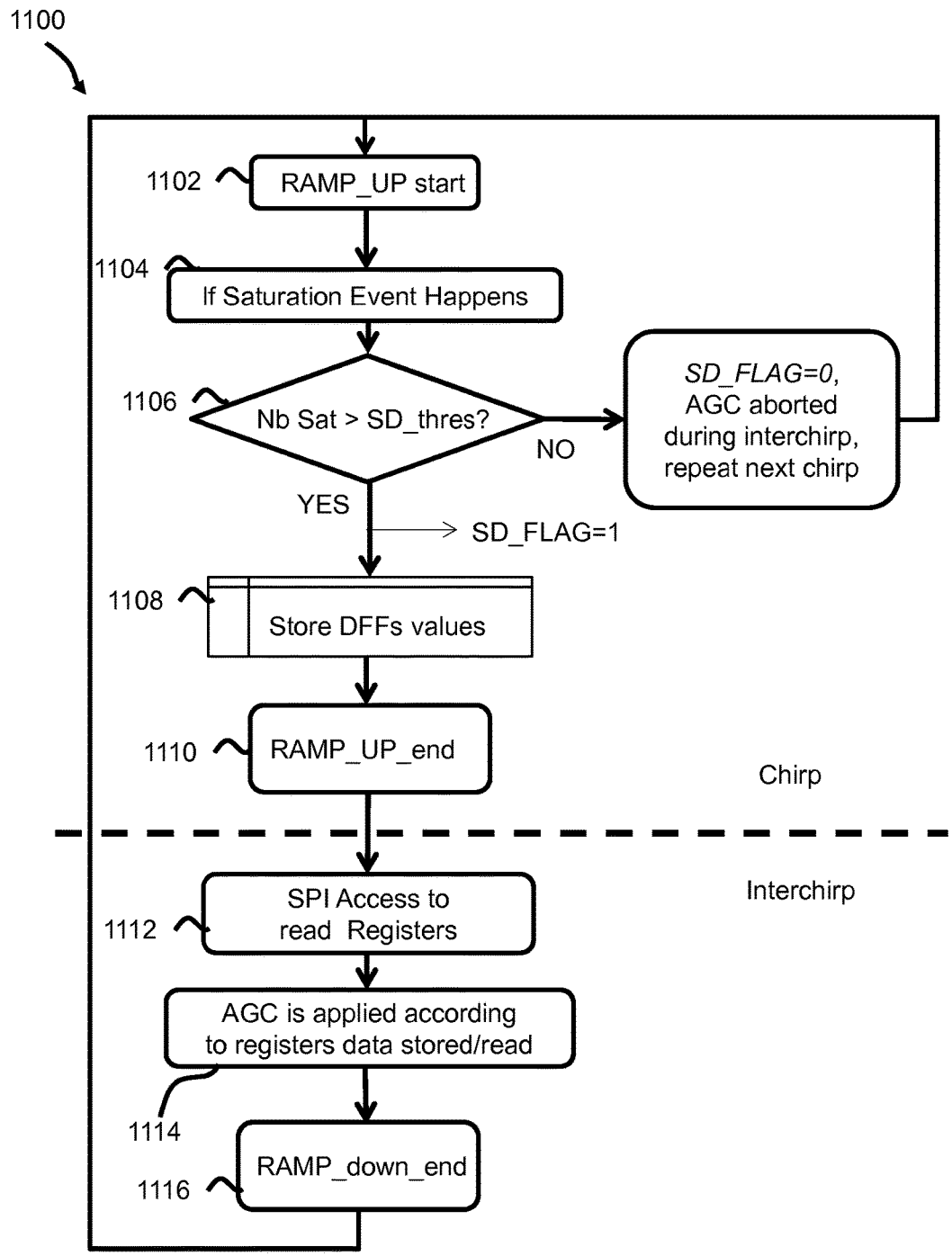
FIG. 11 illustrates an example flowchart associated with the third simplified example representation of an integrated circuit.

Referring to FIG. 11, an example flowchart 1100 associated with the third simplified example representation of the integrated circuit 1000 from FIG. 10 is shown. In this example, prior to a 'chirp' commencing, the threshold value 'SD_Thres' is pre-set to a predetermined value. Subsequently, at 1102, a 'chirp' commences and/or the chirp sequence commences.

If a saturation event occurs at 1104, the saturation detector sense and logic circuit 1070 determines, at 1106, whether the number of saturation events detected is greater than the threshold value 'SD_thres'. This may be achieved by the saturation detector sense and logic circuit 1070 of FIG. 10 receiving an 'SDint' logic high '1' value, which may start a counter that counts the number of saturation events 'Nb_sat'. The saturation detector sense and logic circuit 1070 may then compare the value in the counter to the pre-set threshold value. If it is determined at 1106 that the number of detected saturation events does not exceed the threshold value 'SD_thres', a 'SD_flag' is set to a logic '0' and AGC may be aborted during the 'inter-chip' phase. The process then returns to 1102 to wait for the next 'chirp'.

If it is determined that the number of saturation events does exceed the threshold value 'SD_thres', the 'SD_flag' is set to a logic '1', which triggers relevant logic elements to store instantaneous saturation detector values in their associated registers at step 1108. For example, a 'store ctrl' signal may be generated by the digital controller to enable storing of instantaneous states of the register bits (R0-R11) related to all saturation detector outputs.

At 1110, the ramp-up part of the 'chip' signal ends. This allows the MCU at 1112 to access and read the registers within the digital controller using relevant SPIs when the 'SD_flag' has been asserted as logic '1'. In some examples, this may be as a result of a 'store ctrl' signal being generated at the end of the 'chirp' at 1110. This signal may be tasked with storing the final saturation counter value 'Nb_sat' within the counter registers, for example counter registers 1062, 'Cnt Regs' (C0 . . . $C^{M}-1$), wherein 'M' represents a number of counter bits selected during initial design.

During the 'inter-chirp' region, where no radar information is processed by the digital controller, the MCU can access 1112 the values stored inside the registers, for example registers 1061, 1062. The values within the registers 1061, 1062 represent the gain stages/channels saturating within the receiver and the final number of saturation/bypass events that have occurred during the 'chirp'. Based on this information, the MCU can then apply the correct AGC on a given stage on a particular receiver/channel, based on the information within the registers. At 1116, the 'inter-chirp' phase ends, and the process loops to 1102.

It is envisaged that different implementations of this method are also possible. The overall number of registers, number of bits of saturation counter, saturation threshold value, number of channels and stages may be different from the above mentioned example, and in some examples may be dependent on the radar device receiver architecture.

Figure 12:
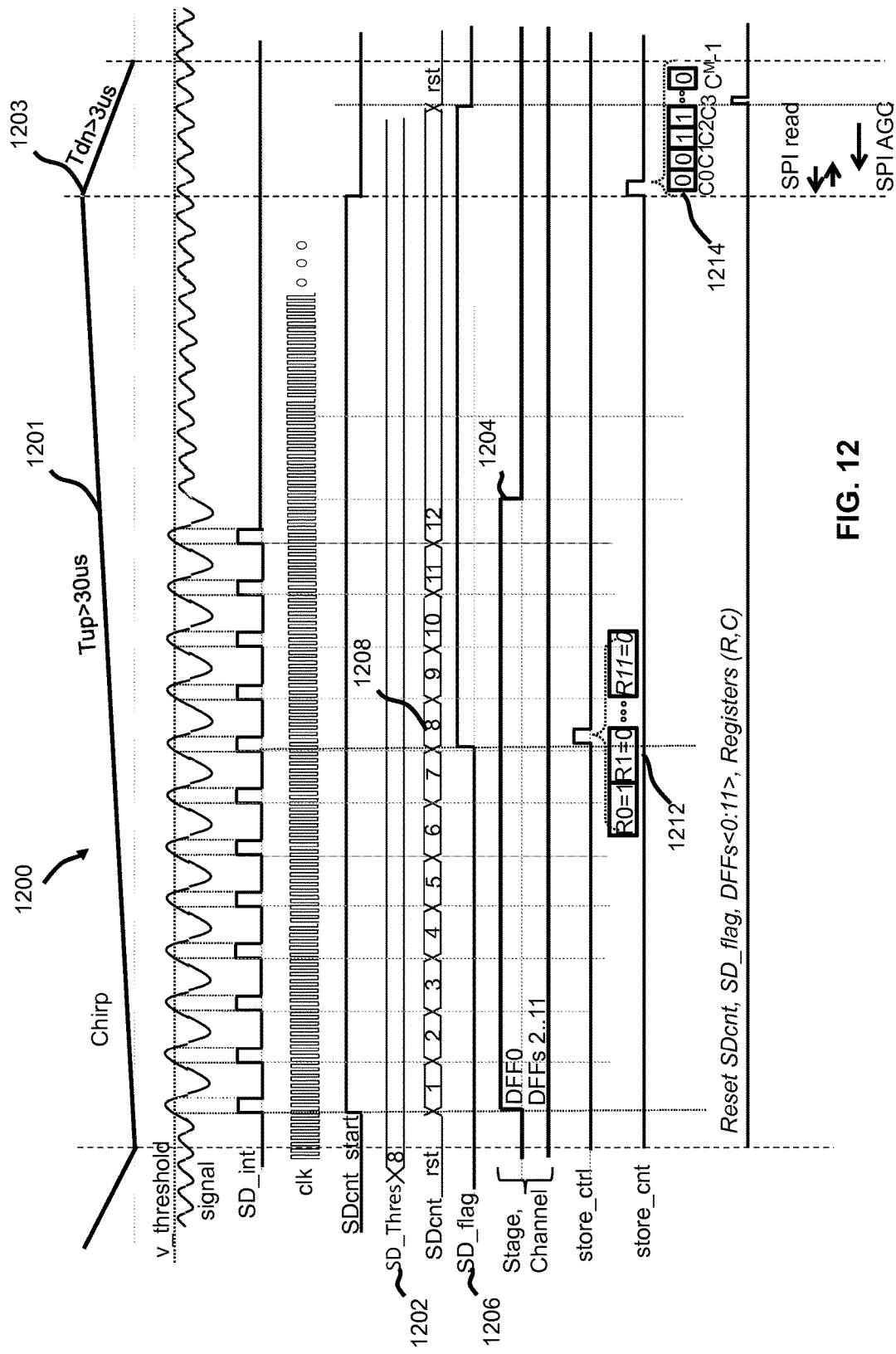
FIG. 12 illustrates an example of a timing diagram associated with the third simplified example representation of an integrated circuit.

Referring to FIG. 12, an example of a timing diagram 1200 associated with the third simplified example representation of the integrated circuit 1000 of FIG. 10 and the flow chart 1100 of FIG. 11 is illustrated.

In this example, the 'SD_thres' 1202 value has been initially set to '8' counts. From FIG. 12 it can be seen that 'DFF0' 1204 has registered a saturation event for twelve counts, leading to 'SD_flag' 1206 outputting a logic '1' value after the eighth count 1208, as the number of saturation events has exceeded the threshold value. In response to this, a 'store_ctrl' signal 1210 is output by the digital controller, thereby enabling the instantaneous values of the saturation detectors to be stored. In this example, the register 1212 associated with 'DFF0' 1204 has stored a logic '1' value.

At the end of the chirp 1201, the MCU is able to read the register 1212 and other associated registers in order to determine where the saturation event has originated from. The MCU can also read the counter register 1214 during the inter-chirp 1203, in order to determine the total number of saturation events that occurred during the 'chirp' 1201.

It is envisaged that in other examples, different implementations of the illustrated architectures and methods are also possible. The overall number of registers, number of bits of saturation counter, saturation threshold value, number of channels and stages can be different from the above mentioned examples, and may be dependent on one or more of: the radar device receiver architecture, the radar application, system configuration, chip partitioning. As such, one example architecture and associated method may be preferred to another.

In the forgoing specification, some examples may be utilised as a saturation detection technique to efficiently apply automatic gain control to a wireless communication device such as a radar device. Examples of gain components that may be assessed include amplifier stages, mixing devices, etc.

Furthermore, although some examples have been implemented for MMW devices, this should not be seen as limiting. It is envisaged that some examples of a radar device may be applied to applications in the frequency range of; 26 GHz or 76-80 GHz—Radar, 60 GHz—WiFi™, 94 GHz—imaging, 20 Gbps/40 Gbps—clock and data recovery, for example. Examples of the invention may also be applied to any other wireless device, such as a mobile phone or base station. In other applications, examples of the invention may also be applied to any device that applies a gain to a signal.

The examples described herein may be particularly useful in multistage, multichannel radar receivers or transceivers where a saturation detection function is implemented. More particularly, the examples described herein may find applicability in architectures where a single saturation pin is used to flag a saturation event inside the receiver.

The examples described herein may be used in any FMCW automotive Radar system and application, whether or not employing a multichip set configuration. The examples described herein may be used in any wireless device, such as a radar device (receiver or transceiver), which employs a microprocessor or microcontroller unit (MCU) and would benefit from a saturation detection operation in order to instigate automatic gain control (AGC).

The examples described herein may also be used in any application, system or integrated circuit where a reduced pin count is mandatory or preferred in order to reduce package size and cost. The examples may be extended to applications where several parallel internal events happen in a wireless device and where there may be a need to combine signals into a single pin output.

In the foregoing specification, some examples have been described with reference to specific example embodiments. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Examples describe an integrated circuit for saturation detection comprising: a plurality of gain components; a plurality of saturation detectors with each saturation detector operably coupled to an output of one of the gain components; a plurality of logic elements with a first input of each logic element associated with an output of one of the saturation detectors; and a controller operably coupled to the plurality of logic elements. The controller is arranged to apply a signal to a second input of individual ones of the plurality of logic elements such that an output of the respective logic element identifies a saturation event of the saturation detector associated with that respective logic element.

Examples may be employed in an integrated circuit comprising a plurality of gain components and a plurality of saturation detectors with each saturation detector operably coupled to an output of one of the gain components. A plurality of logic elements has a first input of each logic element associated with an output of one of the saturation detectors. A controller is operably coupled to the plurality of logic elements and arranged to apply a signal to a second input of individual ones of the plurality of logic elements such that an output of the respective logic element identifies a saturation event of the saturation detector associated with that respective logic element. In other examples, the gain components may be implemented across any number of separate integrated circuits or separate devices interconnected with each other in a suitable manner.

Also, the invention is not limited to physical devices or units implemented in non-programmable hardware but can also be applied in programmable devices or units with wireless capability and able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit for saturation detection, the integrated circuit comprising:
   a plurality of gain components;
   a plurality of saturation detectors with each saturation detector operably coupled to an output of one of the gain components;
   a plurality of logic elements with a first input of each logic element associated with an output of one of the saturation detectors, wherein the plurality of logic elements comprises a plurality of logic AND gates, wherein an output from each of the logic AND gates is operably coupled to a respective register bit to store the logic AND gate output; and
   a controller operably coupled to the plurality of logic AND gates, wherein the controller is arranged to apply a signal to a second input of individual ones of the plurality of logic AND gates such that an output of the respective logic AND gate identifies a saturation event of the saturation detector associated with that respective logic AND gate, and wherein the controller is arranged to receive a trigger to initiate a polling operation of the register bits to identify the individual saturation detector that is subject to the saturation event.

2. The integrated circuit of claim 1 wherein an output from each of the plurality of saturation detectors is coupled to at least one logic gate such that an output from the logic gate identifies that a saturation event has occurred in at least one of the plurality of saturation detectors.

3. The integrated circuit of claim 2 further comprising a single output of the integrated circuit operably coupled to a plurality of logic gates wherein the single output is arranged to identify a respective gain component of the plurality of gain components that is exhibiting a saturation event.

4. The integrated circuit of claim 2 wherein the at least one logic gate is at least one logic OR gate.

5. The integrated circuit of claim 1 wherein a gain component coupled to the individual saturation detector that is subject to the saturation event is arranged to receive a signal to control an adjustment of a gain applied to signals passing there through.

6. The integrated circuit of claim 1 wherein the controller sequentially outputs a logic '1' to an input of each logic AND gate in turn to initiate the polling operation of the register bits.

7. The integrated circuit of claim 6 wherein the controller identifies the individual saturation detector that is subject to a saturation event controller by identifying a logic '1' value in a respective register bit when applying a logic '1' to the logic AND gate input.

8. An integrated circuit for saturation detection, the integrated circuit comprising:
    a plurality of gain components;
    a plurality of saturation detectors with each saturation detector operably coupled to an output of one of the gain components;
    a plurality of logic elements with a first input of each logic element associated with an output of one of the saturation detectors, wherein the plurality of logic elements comprises a plurality of logic AND gates, wherein an output from each of the logic AND gates is operably coupled to a respective register bit to store the logic AND gate output; and
    a controller operably coupled to the plurality of logic AND gates, wherein the controller is arranged to apply a signal to a second input of individual ones of the plurality of logic AND gates such that an output of the respective logic AND gate identifies a saturation event of the saturation detector associated with that respective logic AND gate, and wherein each respective register bit is accessible by an interface port of the integrated circuit to enable external access to the respective register bit thereby identifying the respective gain component that is subject to a saturation event.

9. An integrated circuit for saturation detection, the integrated circuit comprising:
    a plurality of gain components;
    a plurality of saturation detectors with each saturation detector operably coupled to an output of one of the gain components;
    a plurality of logic elements with a first input of each logic element associated with an output of one of the saturation detectors, wherein the plurality of logic elements comprises a plurality of digital flip flops, wherein an output from each of the digital flip flops is operably coupled to a respective register bit to store the digital flip flop output; and
    a controller operably coupled to the plurality of digital flip flops, wherein the controller is arranged to apply a signal to a second input of individual ones of the plurality of digital flip flops such that an output of the respective digital flip flop identifies a saturation event of the saturation detector associated with that respective digital flip flop, and wherein the controller selectively applies a store control signal to a further input of a number of the digital flip flops to freeze the output stored in the register bit.

10. The integrated circuit of claim 1 further comprising sense logic operably coupled to the output of the plurality of saturation detectors and arranged to determine a number of saturation events.

11. The integrated circuit of claim 10 wherein the sense logic outputs a flag to the controller or an external port if the determined number of saturation events is above a pre-set threshold.

12. An integrated circuit for saturation detection, the integrated circuit comprising:
    a plurality of gain components;
    a plurality of saturation detectors with each saturation detector operably coupled to an output of one of the gain components;
    a plurality of logic elements with a first input of each logic element associated with an output of one of the saturation detectors, wherein the plurality of logic elements comprises a plurality of digital flip flops, wherein an output from each of the digital flip flops is operably coupled to a respective register bit to store the digital flip flop output; and
    a controller operably coupled to the plurality of digital flip flops, wherein the controller is arranged to apply a signal to a second input of individual ones of the plurality of digital flip flops such that an output of the respective digital flip flop identifies a saturation event of the saturation detector associated with that respective digital flip flop, and wherein each respective register bit is accessible by an interface port of the integrated circuit to enable external access to the respective register bit thereby identifying the respective gain component that is subject to a saturation event.

13. A radar device comprising:
    a plurality of gain components;
    a plurality of saturation detectors with each saturation detector operably coupled to an output of one of the gain components;
    a plurality of logic elements with a first input of each logic element associated with an output of one of the saturation detectors, wherein the plurality of logic elements comprises a plurality of logic AND gates, wherein an output from each of the logic AND gates is operably coupled to a respective register bit to store the logic AND gate output; and
    a controller operably coupled to the plurality of logic AND gates, wherein the controller is arranged to apply a signal to a second input of individual ones of the plurality of logic AND gates such that an output of the respective logic AND gate identifies a saturation event of the saturation detector associated with that respective logic AND gate, and wherein the controller is arranged to receive a trigger to initiate a polling operation of the register bits to identify the individual saturation detector that is subject to the saturation event.

* * * * *